United States Patent
Mo et al.

(10) Patent No.: US 10,177,341 B2
(45) Date of Patent: Jan. 8, 2019

(54) ENCAPSULATING LAMINATED BODY, ORGANIC LIGHT-EMITTING DEVICE AND PRODUCTION METHODS FOR SAID BODY AND DEVICE

(71) Applicant: LG DISPLAY CO., LTD., Seoul (KR)

(72) Inventors: Sung Ho Mo, Daejeon (KR); Minsoo Kang, Daejeon (KR); Munsup Chung, Daejeon (KR); Jong Sung Park, Daejeon (KR); Seung Won Kang, Daejeon (KR); Dong Hak Son, Daejeon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/127,709

(22) PCT Filed: Mar. 23, 2015

(86) PCT No.: PCT/KR2015/002844
§ 371 (c)(1),
(2) Date: Sep. 20, 2016

(87) PCT Pub. No.: WO2015/142149
PCT Pub. Date: Sep. 24, 2015

(65) Prior Publication Data
US 2017/0222182 A1    Aug. 3, 2017

(30) Foreign Application Priority Data
Mar. 21, 2014  (KR) ........................ 10-2014-0033656

(51) Int. Cl.
 *H01L 51/52*  (2006.01)
 *H01L 51/56*  (2006.01)
(Continued)

(52) U.S. Cl.
CPC ............ *H01L 51/5253* (2013.01); *B32B 7/12* (2013.01); *B32B 27/06* (2013.01); *B32B 37/00* (2013.01);
(Continued)

(58) Field of Classification Search
CPC . H01L 51/5253; H01L 51/5268; H01L 51/56; B32B 27/06; B32B 37/14; B32B 37/12; B32B 7/12; B32B 2457/206
See application file for complete search history.

(56) References Cited

U.S. PATENT DOCUMENTS 7,365,442 B2    4/2008  Pichler
2006/0003474 A1  1/2006  Tyan et al.
(Continued)

FOREIGN PATENT DOCUMENTS

CN    103345084 A    10/2013
JP    2000-58271 A    2/2000
(Continued)

*Primary Examiner* — Jay C Chang
(74) *Attorney, Agent, or Firm* — Birch, Stewart, Kolasch & Birch, LLP

(57) ABSTRACT

The present application relates to a laminate for encapsulation, an organic light emitting apparatus, and methods for manufacturing the same, and process costs may be reduced and productivity may be significantly enhanced by manufacturing the organic light emitting apparatus using the laminate for encapsulation through a roll process.

12 Claims, 5 Drawing Sheets

(51) Int. Cl.
*B32B 37/00* (2006.01)
*B32B 37/12* (2006.01)
*B32B 7/12* (2006.01)
*B32B 27/06* (2006.01)
*B32B 37/14* (2006.01)

(52) U.S. Cl.
CPC .............. *B32B 37/12* (2013.01); *B32B 37/14* (2013.01); *H01L 51/524* (2013.01); *H01L 51/5268* (2013.01); *H01L 51/56* (2013.01); *B32B 2457/206* (2013.01); *H01L 51/5203* (2013.01)

(56) References Cited

U.S. PATENT DOCUMENTS

| | | | |
|---|---|---|---|
| 2006/0068210 A1 | 3/2006 | Kanakarajan | |
| 2009/0000729 A1 | 1/2009 | Danner et al. | |
| 2010/0040842 A1 | 2/2010 | Everaerts et al. | |
| 2011/0234052 A1 | 9/2011 | Amano et al. | |
| 2012/0069288 A1 | 3/2012 | Das et al. | |
| 2013/0026503 A1* | 1/2013 | Son ..................... | H01L 51/5243 257/88 |
| 2013/0207093 A1 | 8/2013 | Jeong et al. | |
| 2013/0320842 A1 | 12/2013 | Park et al. | |
| 2016/0021732 A1 | 1/2016 | Zhou | |

FOREIGN PATENT DOCUMENTS

| | | | | |
|---|---|---|---|---|
| JP | 2006-86084 A | 3/2006 | | |
| JP | 2007-103093 A | 4/2007 | | |
| JP | 2007-194115 A | 8/2007 | | |
| JP | 2008-234929 A | 10/2008 | | |
| JP | 2009-4274 A | 1/2009 | | |
| JP | 2009-123645 A | 6/2009 | | |
| JP | 2011-44360 A | 3/2011 | | |
| JP | 2013-115008 A | 6/2013 | | |
| JP | 2014-116115 A | 6/2014 | | |
| KR | 10-2011-0029769 A | 3/2011 | | |
| KR | 10-2012-0004943 A | 1/2012 | | |
| KR | 10-2013-0014111 A | 2/2013 | | |
| KR | 10-2013-0072651 A | 7/2013 | | |
| KR | 20130072651 A | * 7/2013 | ............. | H01L 51/56 |
| KR | 10-2013-0134919 A | 12/2013 | | |
| KR | 10-2014-0015038 A | 2/2014 | | |
| WO | WO 2010/019528 A2 | 2/2010 | | |
| WO | WO 2010/024006 A1 | 3/2010 | | |

* cited by examiner

ENCAPSULATING LAMINATED BODY, ORGANIC LIGHT-EMITTING DEVICE AND PRODUCTION METHODS FOR SAID BODY AND DEVICE

CROSS REFERENCE TO RELATED APPLICATIONS

This application is the National Phase of PCT International Application No. PCT/KR2015/002844, filed on Mar. 23, 2015, which claims priority under 35 U.S.C. 119(a) to Patent Application No. 10-2014-0033656, filed in the Republic of Korea on Mar. 21, 2014, all of which are hereby expressly incorporated by reference into the present application.

TECHNICAL FIELD

This application claims priority to and the benefits of Korean Patent Application No. 10-2014-0033656, filed with the Korean Intellectual Property Office on Mar. 21, 2014, the entire contents of which are incorporated herein by reference.

The present application relates to a laminate for encapsulation, an organic light emitting apparatus, and methods for manufacturing the same. More specifically, the present application relates to a laminate for encapsulation of an organic light emitting apparatus, an organic light emitting apparatus manufactured using the laminate for encapsulation, and methods for manufacturing the same.

BACKGROUND ART

An organic light emitting device is a device injecting holes and electrons to a light emitting layer formed between two electrodes through the electrode, and producing light as the injected holes and electrons form excitions and then dissipate.

Such an organic light emitting device has a spontaneous light emitting property, and has advantages in that it is thinner compared to existing liquid crystal displays, has low power consumption, has an excellent viewing angle and has a high speed of response. In addition, such an organic light emitting device has advantages of having low power consumption since driving is possible at a low voltage of 10 V or less and having an excellent color sense compared to plasma display panels or inorganic EL panel displays. Moreover, an organic light emitting device may be manufactured using a plastic substrate having a bending property.

In addition, an organic light emitting device is divided into a passive type and an active type. A passive type chooses a bottom light emitting mode that emits light produced in a light emitting layer to a substrate surface. Meanwhile, when an active type chooses a bottom light emitting mode, an aperture ratio decreases due to the concealment by a TFT. Accordingly, a top light emitting mode that emits light to a side opposite to a substrate may be used in order to increase an aperture ratio.

DISCLOSURE

Technical Problem

As development and application of organic light emitting apparatuses increase, studies on technologies capable of saving process costs and enhancing productivity from simplifying a process manufacturing organic light emitting apparatuses have been required.

Technical Solution

One embodiment of the present application provides a method for manufacturing a laminate for encapsulation including steps of laminating an encapsulation film and an adhesive film; and laminating the adhesive film with a protective film.

The step of laminating an encapsulation film and an adhesive film may be carried out by laminating an adhesive film in a film form on an encapsulation film, however, may also be carried out by forming an adhesive film through coating an adhesive composition on an encapsulation film, and then curing the result.

Another embodiment of the present application provides a method for manufacturing a laminate for encapsulation including steps of laminating a protective film and an adhesive film; and laminating the adhesive film with an encapsulation film.

The step of laminating a protective film and an adhesive film may be carried out by laminating an adhesive film in a film form on a protective film, however, may also be carried out by coating an adhesive film through coating an adhesive composition on a protective film and curing the result.

The methods for manufacturing a laminate for encapsulation of the embodiments described above may further include a step of forming an additional polymer layer on a surface opposite to the surface adjoining the adhesive film of the encapsulation film. The step of forming a polymer layer may be carried out before, after or simultaneously with laminating the encapsulation film and the adhesive film. The polymer layer may be formed using a method of laminating a polymer film. An adhesive or gluing agent may be used as necessary for the lamination.

Another embodiment of the present application provides a method for manufacturing a laminate for encapsulation, in which an encapsulation film, an adhesive film provided on any one surface of the encapsulation film, and a protective film provided on a surface opposite to the surface provided with the encapsulation film of the adhesive film are included, including steps of forming two or more pattern units including an encapsulation layer and an adhesive layer provided on any one surface of the encapsulation layer by cutting the encapsulation film and the adhesive film in a film thickness direction without cutting the protective film; and removing a side film between the pattern units so that the pattern units are separated from each other.

The method for manufacturing a laminate for encapsulation according to the embodiment may further include a step of attaching a carrier film so as to cover all the encapsulation layers of the two or more pattern units.

Another embodiment of the present application provides a method for manufacturing an organic light emitting apparatus, in which a laminate for encapsulation includes two or more pattern units including an encapsulation layer and an adhesive layer provided on any one surface of the encapsulation layer, and disposed to be separated from each other; and a protective film provided on the adhesive layer side of the pattern unit and covering all the adhesive layers of the two or more pattern units, including steps of removing the protective film while fixing the pattern unit side of the laminate for encapsulation on a stage of an apparatus or on a separate tray for cohesion with an organic light emitting unit; and cohering an organic light emitting device including a substrate and two or more organic light emitting units provided on the substrate to the adhesive layer side of the laminate for encapsulation so that each of the pattern units and each of the organic light emitting units correspond to each other. After the cohesion, the apparatus or tray for cohesion with the organic light emitting unit is separated from the laminate for encapsulation.

Another embodiment of the present application provides a method for manufacturing an organic light emitting apparatus, in which a laminate for encapsulation includes two or more pattern units including an encapsulation layer and an adhesive layer provided on any one surface of the encapsulation layer, and disposed to be separated from each other; a protective film provided on the adhesive layer side of the pattern unit, and covering all the adhesive layers of the two or more pattern units; and a carrier film provided on the encapsulation layer side of the pattern unit, and covering all the encapsulation layers of the two or more pattern units, including steps of removing the protective film from the laminate for encapsulation; and cohering an organic light emitting device including a substrate and two or more organic light emitting units provided on the substrate to the adhesive layer side of the laminate for encapsulation so that each of the pattern units and each of the organic light emitting units correspond to each other.

Another embodiment of the present application provides a method for manufacturing an organic light emitting apparatus, in which a laminate for encapsulation includes two or more pattern units including an encapsulation layer and an adhesive layer provided on any one surface of the encapsulation layer, and disposed to be separated from each other; a protective film provided on the adhesive layer side of the pattern unit, and covering all the adhesive layers of the two or more pattern units; and a carrier film provided on the encapsulation layer side of the pattern unit, and covering all the encapsulation layers of the two or more pattern units, including steps of removing the protective film from the laminate for encapsulation; cohering an organic light emitting device including a substrate and two or more organic light emitting units provided on the substrate to the adhesive layer side of the laminate for encapsulation so that each of the pattern units and each of the organic light emitting units correspond to each other; and removing the carrier film from the laminate for encapsulation.

Another embodiment of the present application provides a laminate for encapsulation including an encapsulation film; an adhesive film provided on any one surface of the encapsulation film; and a protective film provided on a surface opposite to the surface provided with the encapsulation film of the adhesive film.

Another embodiment of the present application provides a laminate for encapsulation including two or more pattern units including an encapsulation layer and an adhesive layer provided on any one surface of the encapsulation layer, and disposed to be separated from each other; and a protective film provided on the adhesive layer side of the pattern unit, and covering all the adhesive layers of the two or more pattern units. As necessary, the laminate for encapsulation may further include a carrier film provided on the encapsulation layer side of the pattern unit, and covering all the encapsulation layers of the two or more pattern units.

Another embodiment of the present application provides an organic light emitting apparatus including two or more pattern units including an encapsulation layer and an adhesive layer provided on any one surface of the encapsulation layer, and disposed to be separated from each other; an organic light emitting device provided on the adhesive layer side of the pattern unit and including a substrate and two or more organic light emitting units provided on the substrate, wherein each of the organic light emitting units is provided so as to correspond to each of the pattern units; and a carrier film provided on the encapsulation layer side of the pattern unit, and covering all the encapsulation layers of the two or more pattern units. Herein, the state of each of the organic light emitting units being provided so as to correspond to each of the pattern units includes a state of each of the organic light emitting units being covered with each of the pattern units.

Another embodiment of the present application provides an organic light emitting apparatus including two or more pattern units including an encapsulation layer and an adhesive layer provided on any one surface of the encapsulation layer, and disposed to be separated from each other; and an organic light emitting device provided on the adhesive layer side of the pattern unit and including a substrate and two or more organic light emitting units provided on the substrate, wherein each of the organic light emitting units is provided so as to correspond to each of the pattern units. Herein, the state of each of the organic light emitting units being provided so as to correspond to each of the pattern units includes a state of each of the organic light emitting units being covered with each of the pattern units.

Another embodiment of the present application provides an illumination apparatus or a display apparatus including the organic light emitting apparatus.

According to an additional embodiment, the encapsulation film may be an inorganic material film, or an inorganic material pattern film including a support layer and two or more inorganic material patterns provided on the support layer.

According to an additional embodiment, the support layer is an insulation layer.

According to an additional embodiment, the inorganic material is a metal.

According to an additional embodiment, the encapsulation film is metal foil, or a metal clad film including an insulation layer and two or more metal patterns provided on at least one surface of the insulation layer. As another example of the encapsulation film, an organic material film having a barrier property for oxygen or moisture, or a film having a laminated structure in which an organic material layer and an inorganic material layer are laminated alternately may be used.

According to an additional embodiment, the encapsulation layer may be an inorganic material layer, or an inorganic material pattern layer including a support layer and an inorganic material pattern provided on the support layer.

According to an additional embodiment, the encapsulation layer is a metal foil layer, or a metal clad layer including an insulation layer and a metal pattern provided on at least one surface of the insulation layer.

Advantageous Effects

According to embodiments of the present application, an organic light emitting apparatus including a number of organic light emitting units can be manufactured using a roll lamination method, and the roll lamination method may also be used in an encapsulation process, and accordingly, the process can be greatly simplified, and as a result, process costs can be reduced and productivity can be significantly enhanced. Particularly, process efficiency can be greatly enhanced when manufacturing large-area organic light emitting apparatuses.

MODE FOR DISCLOSURE

Hereinafter, the present invention will be described in detail.

Figure 1:
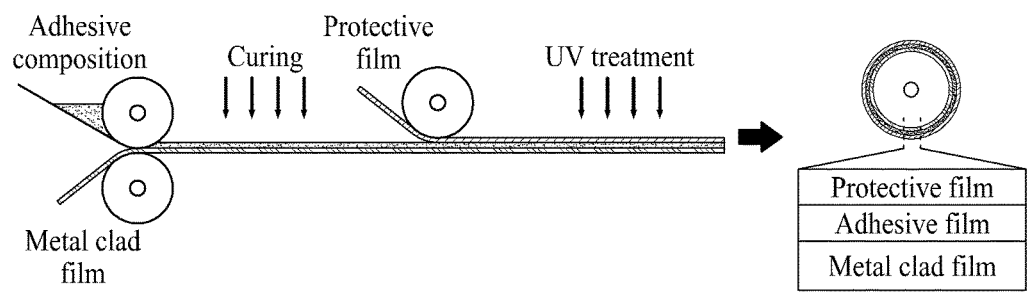
FIG. 1 shows a mimetic diagram of a first process according to one embodiment of the present application.

One embodiment of the present application provides a method for manufacturing a laminate for encapsulation including steps of laminating an encapsulation film and an adhesive film; and laminating the adhesive film with a protective film. According to one embodiment, the encapsulation film may be an inorganic material film, or an inorganic material pattern film including a support layer and two or more inorganic material patterns provided on the support layer. According to one embodiment, the inorganic material is a metal. According to one embodiment, the encapsulation film is metal foil, or a metal clad film including an insulation layer and two or more metal patterns provided on at least one surface of the insulation layer. A mimetic diagram of the method according to the embodiment described above is shown in FIG. 1. In descriptions below relating to the drawings, a metal clad film will be described as an example of the encapsulation film, however, the metal clad film may be substituted with other encapsulation film types. As shown in FIG. 1, in the method according to the embodiment described above, formation of a laminated structure of the metal clad film and the adhesive film, and lamination of the laminated structure and the protective film may be carried out using a roll lamination method.

The method according to the embodiment described above may further include a step of winding the laminate for encapsulation in a roll form. In this case, the wound roll may be favorably used in a process carried out after the method described above. Particularly, a continuous process using the roll may also be used in the post processes, process efficiency may be greatly improved.

When the laminate for encapsulation is wound in a roll form, the laminate for encapsulation may be wound so that the encapsulation film is provided closer to the rotation axis of the roll than the protective film, or the laminate for encapsulation may be wound so that the protective film is provided closer to the rotation axis of the roll than the encapsulation film.

The adhesive composition is not particularly limited as long as it is a material having an adhesive property by UV, heat or pressure, and for example, a heat-curable adhesive composition may be used. According to one embodiment, the adhesive composition has a property of a pressure-sensitive adhesive after heat curing.

According to one embodiment, the adhesive composition includes a sealing material. Herein, the sealing material means a material having a property of protecting an organic light emitting device from oxygen or moisture by blocking or absorbing oxygen or moisture.

The adhesive composition may be coated on the encapsulation film using a roll coating method.

The lamination of the adhesive film having a laminated structure and the protective film is not particularly limited, but may be carried out by roll lamination. Additional treatments may be carried out either during or after the roll lamination process, and for example, a treatment of applying UV, heat, pressure and the like may be carried out. An adhesive property of the adhesive film described above may be enhanced, or processability may be improved by such an additional treatment. As one example, after laminating the adhesive film and the protective film by roll lamination, a UV treatment may be carried out.

In the embodiment described above, the protective film is not particularly limited as long as it is known in the art, and films used in general film processes such as a polarizing plate (Pol) and a film-type patterned retarder (FPR) may also be used.

According to one embodiment, the encapsulation film includes a support layer and two or more inorganic material patterns provided on at least one surface of the support layer, and each of the inorganic material patterns is a pattern used in one organic light emitting unit. For example, each of the inorganic material patterns has a shape and a size capable of covering one organic light emitting unit.

According to one embodiment, the inorganic material pattern is a metal pattern, and the inorganic material pattern film is a metal clad film including an insulation layer and two or more metal patterns provided on at least one surface of the insulation layer. Each metal pattern of the metal clad film is a pattern used in one organic light emitting unit, for example, a pattern used to cover one organic light emitting unit.

For example, each of the metal patterns may be a metal sealing pattern covering one organic light emitting unit, and may additionally include a printed circuit pattern for connecting an electrode to external power in one organic light emitting unit.

The material of the metal pattern of the metal clad film is not particularly limited as long as it has physical properties required for organic light emitting unit encapsulation. For example, the material is not particularly limited as long as it is a metal material having an oxygen and/or moisture blocking ability in order to be used as a metal sealing pattern. For example, the material of the metal pattern may include one or more types of copper, aluminum, iron, magnesium, calcium, sodium, potassium, titanium, indium, yttrium, lithium, gadolinium, platinum, gold, tungsten, tantalum, silver, tin, lead and the like, but is not limited thereto, and copper may be most preferably used.

The metal pattern may be formed by laminating a metal pattern cut in advance on an insulation layer, or by depositing a metal layer on an insulation layer and patterning the result.

The thickness of the metal pattern may be from 1 μm to 50 μm, from 2 μm to 40 μm, and from 5 μm to 20 μm, but is not limited thereto.

According to one embodiment, each metal pattern of the metal clad film includes a metal sealing pattern provided so as to be located on the top of each organic light emitting unit to be described later. The metal sealing pattern may correspond to the size of a light emitting unit of the organic light emitting unit to be laminated later or may be larger than the size of the organic light emitting unit.

According to another embodiment, each metal pattern of the metal clad film includes a first metal pattern electrically connecting the first electrode of each organic light emitting unit to be described later, and a second metal pattern electrically connecting the second electrode and external power.

According to another embodiment, each metal pattern of the metal clad film includes the metal sealing pattern, the first metal pattern and the second metal pattern.

The insulation layer of the metal clad film is not particularly limited as long as it has an insulating property. For example, an insulating polymer, specifically, polyimide, polyester, an epoxy resin and the like may be used. Polyimide may be preferably used, however, the insulation layer is not limited thereto.

The thickness of the insulation layer may be from 1 μm to 50 μm, and from 5 μm to 20 μm, but is not limited thereto.

Figure 5:
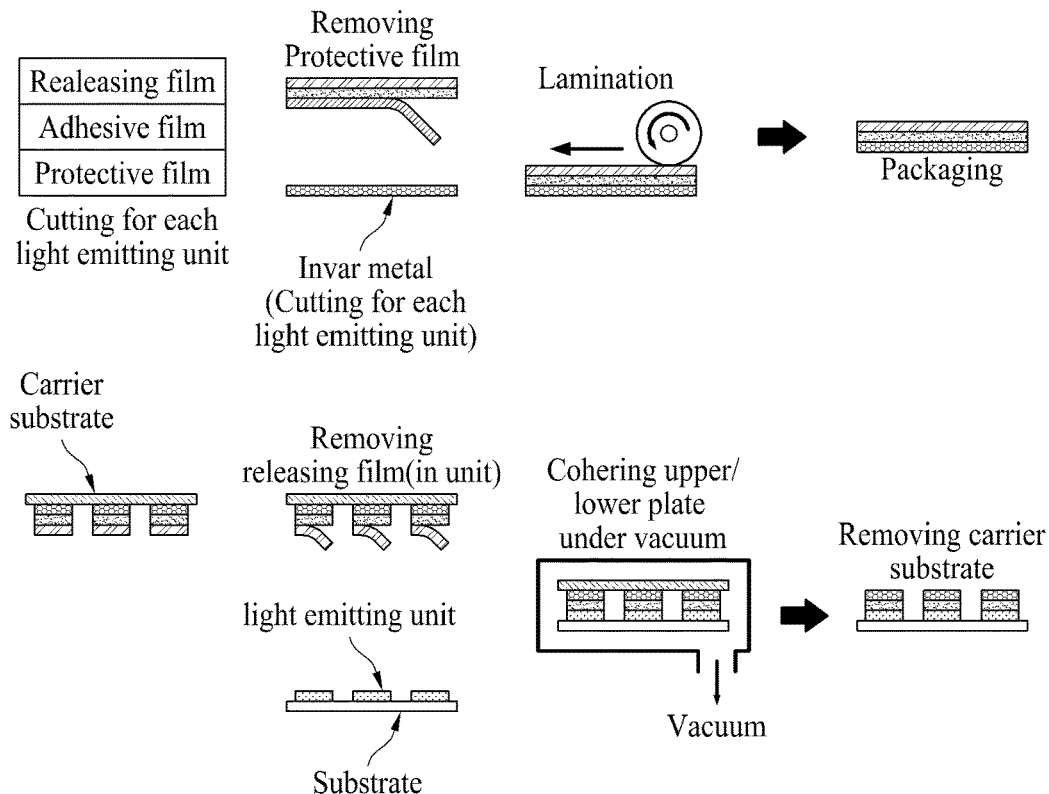
FIG. 5 illustrates a process according to an existing technology.

In existing technologies, a releasing film and a protective film are each attached to both sides of an adhesive film, the result is cut to fit the size of each organic light emitting unit, the protective film is removed, and then metal sealing patterns, for example, invar metals, cut to fit the size of each of the organic light emitting units are laminated thereon. Meanwhile, each of the organic light emitting units is attached to a carrier substrate. The releasing films are removed from each of the metal sealing patterns, and the result is vacuum laminated to the organic light emitting unit. Subsequently, the carrier substrate is removed. An existing process is illustrated in FIG. 5.

However, according to an embodiment of the present application, an adhesive film is coated or laminated at once using a roll process without cutting and attaching a metal clad film including a metal sealing pattern for each organic light emitting unit, and the result may be cut using a roll process, and a number of organic light emitting units may be cohered at once using a roll process, therefore, there are many advantages in terms of a process.

Particularly, when cohering a carrier substrate including invar metals and an organic light emitting unit in existing technologies and both are rigid, the process needs to be progressed under vacuum in order to remove bubbles between the two hard substrates. However, according to an embodiment of the present application, at least a laminate for encapsulation including a metal clad film, an adhesive film and a protective film may be flexible, and a considerable amount of bubbles may be removed even when cohering the laminate for encapsulation with an organic light emitting unit using roll lamination in an environment that is not vacuum, and when necessary, residual microbubbles may be removed in a post process, for example, through an autoclave.

The metal clad film may include a contact hole electrically connecting external power and a first electrode or a second electrode of an organic light emitting unit to be cohered later. The contact hole may be formed using methods known in the art. In addition, the contact hole may include a conductive paste inside in order to electrically connect external power and a first electrode or a second electrode. The conductive paste may include one or more types selected from among Ag, Au, Cu, Ni, Al, W, Co, Pd and alloys thereof, but is not limited thereto.

According to one embodiment, the method for manufacturing a laminate for encapsulation of the embodiments described above may further include a step of forming an additional polymer layer on a surface opposite to the surface adjoining the adhesive film of the encapsulation film. The polymer layer may protect the encapsulation film, and carry out encapsulation more stably. The material of the polymer layer is not particularly limited, and polyimide (PI), polyethylene terephthalate (PET), polyethylene (PE) and the like may be used, but the material is not limited thereto. The step of forming a polymer layer may be carried out before, after or simultaneously with the lamination of the encapsulation film and the adhesive film. The polymer layer may be formed by laminating a polymer film. An adhesive or a gluing agent may be used for the lamination as necessary.

According to one embodiment, the laminate for encapsulation may further include an anisotropic conductive film electrically connecting external power and a first electrode or a second electrode of an organic light emitting unit to be cohered later. As the anisotropic conductive film, a heat-curable resin film including a conductive ball formed with small conductive particles may be used.

According to one embodiment, the adhesive film may include a conductive ball. The conductive ball may perform a role of electrically connecting external power and the first electrode or the second electrode.

According to one embodiment, the metal clad film may further include a first metal pad electrically connected to a first electrode of an organic light emitting unit to be cohered later on the insulation layer. In addition, the metal clad film may further include a second metal pad electrically connected to a second electrode on the insulation layer. Furthermore, the metal clad film may include both a first metal pad and a second metal pad on the insulation layer. In addition, an additional insulation layer may be provided between the first metal pad and the second metal pad.

According to one embodiment, the encapsulation film is metal foil. Aluminum foil may be used as the metal foil, however, the metal foil is not limited thereto.

Figure 2:
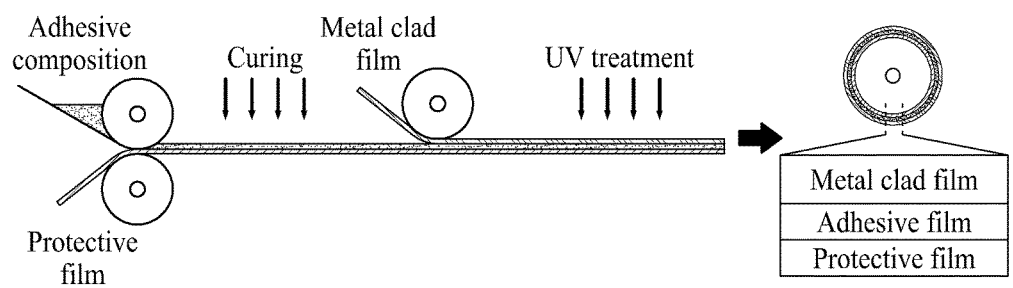
FIG. 2 shows a mimetic diagram of a first process according to another embodiment of the present application.

Another embodiment of the present application provides a method for manufacturing a laminate for encapsulation including steps of laminating a protective film and an adhesive film; and laminating the adhesive film with an encapsulation film. A mimetic diagram of the method according to the embodiment described above is shown in FIG. 2. The step of laminating a protective film and an adhesive film may be carried out by laminating a film-type adhesive film on a protective film, and may also be carried out by forming an adhesive film through coating an adhesive composition on a protective film and curing the result. In the embodiment illustrated in FIG. 2, descriptions on the embodiment illustrated in FIG. 1 may all apply, except that the adhesive composition is coated on the protective film instead of the metal clad film, and the result is laminated with the metal clad film later.

Figure 3:
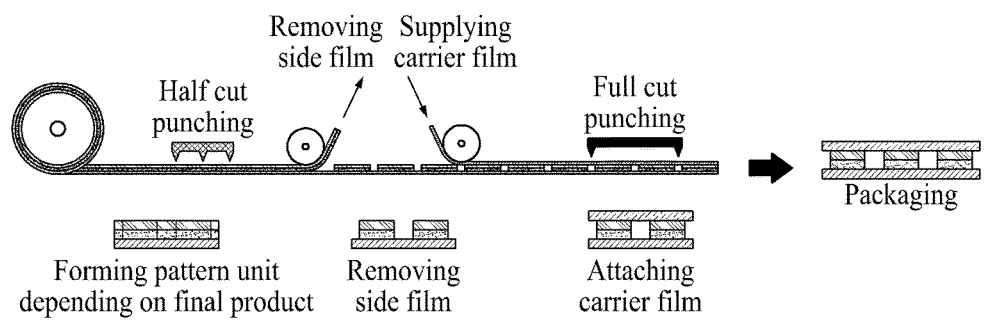
FIG. 3 shows a mimetic diagram of a second process according to one embodiment of the present application.

Another embodiment of the present application provides a method for manufacturing a laminate for encapsulation, in which an encapsulation film, an adhesive film provided on any one surface of the encapsulation film, and a protective film provided on a surface opposite to the surface provided with the encapsulation film of the adhesive film are included, including steps of forming two or more pattern units including an encapsulation layer and an adhesive layer provided on any one surface of the encapsulation layer by cutting the encapsulation film and the adhesive film in a film thickness direction without cutting the protective film; and removing a side film between the pattern units so that the pattern units are separated from each other. As necessary, the manufacturing method described above may further include a step of attaching a carrier film on the side provided with the encapsulation layers of the pattern units so as to cover all the encapsulation layers of the two or more pattern units. A mimetic diagram of the method according to the embodiment described above is shown in FIG. 3. FIG. 3 illustrates a method using a carrier film, however, even when a carrier film is not attached, FIG. 3 applies except that the surface on which the carrier film of the laminate for encapsulation is attached is directly fixed on a stage of an apparatus or on a tray for cohesion with an organic light emitting unit described above instead of the carrier film.

A method of cutting the encapsulation film and the adhesive film in a film thickness direction without cutting the protective film may be referred to as half cut punching or half cutting in the present specification. Such a cutting method is not particularly limited. As the size of the pattern that is half cut, different rules may apply for each model depending on the form of a final product. Half cutting is a selective process in which some films of the laminated films need to be cut, and a punching process is preferable in terms of a process. In the present specification, the pattern unit means a unit cohering to each organic light emitting unit in a post process. The pattern shape or size of the pattern unit may be determined in advance when designing a process depending on a target final product.

In the present specification, a side film means a portion having the same laminated structure as the pattern unit, but not laminated to organic light emitting units in a final product, thereby needing to be removed in advance. The side film may also be removed using a roll process. As one example, a simple method of hanging a half cut laminate on a roll and continuously removing the film may be used. Such a method is used in general film processes. The side film may be removed in the same manner as removing a protective film in a film process. When an additional polymer layer is provided on the encapsulation film side of the laminate for encapsulation, the polymer layer is also cut in a thickness direction in the step of cutting the encapsulation film and the adhesive film in a film thickness direction without cutting the protective film.

According to one embodiment, as shown in FIG. 3, a step of cutting the laminate for encapsulation so that the laminate has a fixed number of pattern units may be additionally carried out. FIG. 3 illustrates a laminate for encapsulation in a state of a carrier film being attached thereon, however, a step of cutting the laminate may be carried out in the same manner when a carrier film is not attached thereon. The number of pattern units included in the cut laminate may be determined depending on the size of a substrate of an organic light emitting device to be cohered later. For example, those having various sizes such as a second generation and a fifth generation may be used as a substrate of an organic light emitting device. In addition, the laminate may be cut so that the number of the pattern units is the same as the number of organic light emitting devices included in an apparatus including the organic light emitting devices. Such a cutting step is different from the half cutting step, and may be referred to as full cut punching or full cutting in terms that the whole laminate is cut in a thickness direction. The full cutting is not particularly limited, and a punching method may be used like the half cutting described above, however, laser or wheel cutting may be used.

In the present specification, a carrier film is used for the convenience of a process, and special properties are not required. General films such as PE, PET and PEN may be used, and an inexpensive film is preferable. As the carrier film, a film coated with a slightly sticky film may be used for easy removal after process completion.

Another embodiment of the present application provides a method for manufacturing an organic light emitting apparatus, in which a laminate for encapsulation includes two or more pattern units including an encapsulation layer and an adhesive layer provided on any one surface of the encapsulation layer, and disposed to be separated from each other; and a protective film provided on the adhesive layer side of the pattern unit and covering all the adhesive layers of the two or more pattern units, including steps of removing the protective film while fixing the pattern unit side of the laminate for encapsulation on a stage of an apparatus or on a tray for cohesion with an organic light emitting unit; and cohering an organic light emitting device including a substrate and two or more organic light emitting units provided on the substrate to the adhesive layer side of the laminate for encapsulation so that each of the pattern units and each of the organic light emitting units correspond to each other. After the cohesion, the apparatus or tray for cohesion with the organic light emitting unit is separated from the laminate for encapsulation.

Figure 4:
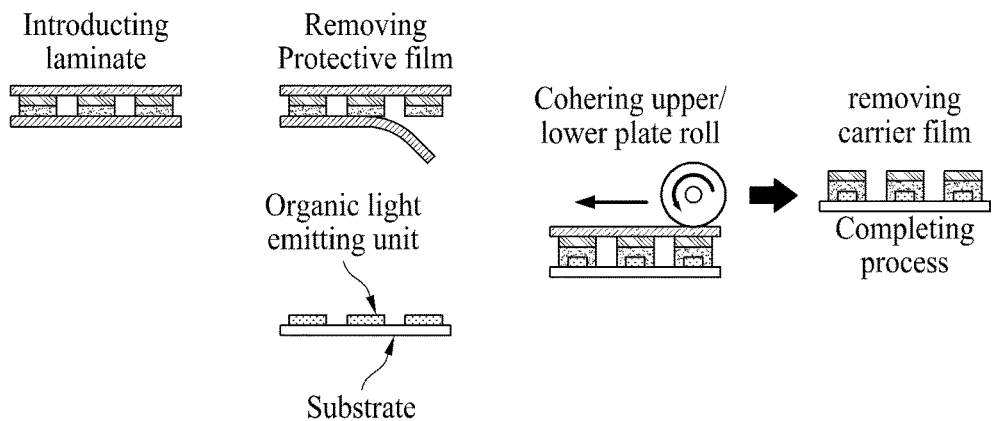
FIG. 4 shows a mimetic diagram of a third process according to one embodiment of the present application.

Herein, the apparatus for cohesion with an organic light emitting unit is an apparatus used for cohering the laminate for encapsulation with an organic light emitting unit without a carrier film. The tray is means transporting the laminate for encapsulation for cohering the laminate for encapsulation with an organic light emitting unit without a carrier film. When such an apparatus or tray is used, processes of attaching and removing a carrier film are not included resulting in process cost savings. As necessary, in the apparatus or tray for cohesion with an organic light emitting unit, the stage surface or tray surface on which the pattern unit of the laminate for encapsulation is fixed may have a gluing property. The gluing property may be provided by the stage or tray surface being formed with a material having a gluing property, or by additionally using and a gluing agent layer or gluing tape. When such an apparatus or tray is used instead of a carrier film as in the present embodiment, descriptions in FIG. 4 may apply except that the apparatus or tray is used instead of the carrier film.

Another embodiment of the present application provides a method for manufacturing an organic light emitting apparatus, in which a laminate for encapsulation includes two or more pattern units including an encapsulation layer and an adhesive layer provided on any one surface of the encapsulation layer, and disposed to be separated from each other; a protective film provided on the adhesive layer side of the pattern unit, and covering all the adhesive layers of the two or more pattern units; and a carrier film provided on the encapsulation layer side of the pattern unit, and covering all the encapsulation layers of the two or more pattern units, including steps of removing the protective film from the laminate for encapsulation; and cohering an organic light emitting device including a substrate and two or more organic light emitting units provided on the substrate to the adhesive layer side of the laminate for encapsulation so that each of the pattern units and each of the organic light emitting units correspond to each other. The method according to the embodiment described above is illustrated in FIG. 4.

In order to remove the protective film, methods of removing a protective film used in general film processes may be used. For example, a method of using an adhesive tape and a method utilizing a sticky roller may be used for removal.

When cohering the pattern unit including the encapsulation film to the organic light emitting unit, a method of cohesion by identifying marks, patterns and the like present in the substrate and the encapsulation film using a CCD Camera and moving the position may be used in aligning, and a method used in TFT and OLED processes generally requiring aligning may be used.

In the step of removing the protective film, one continuous protective film is used in the present application, therefore, there is an advantage in that an aligning process is not required compared to an existing technology illustrated in FIG. 5. However, although aligning is not required for each organic light emitting unit, aligning is required for the whole substrate, for example, a glass substrate unit. In order to smoothly remove the protective film, the adhesive strength of the protective film for the laminate is preferably smaller than the adhesive strength of the carrier film.

According to one embodiment, cohesion of the laminate for encapsulation and the organic light emitting device may be carried out so that each of the pattern units of the laminate for encapsulation covers each of the organic light emitting units. In this case, the side surface as well as the upper surface of the organic light emitting unit is covered by the adhesive layer and the encapsulation layer, and therefore, the organic light emitting unit may be protected from an external environment such as moisture or oxygen. For this, the width of each pattern unit of the laminate for encapsulation may be designed to be the same as or larger than the width of each organic light emitting unit. In addition, the width of the encapsulation layer included in the pattern unit may be designed to be the same as or larger than the width of the adhesive layer. However, the relative area of the organic light emitting unit becomes small when the width difference is too big, and the width difference may be determined considering a light emitting area and light emitting efficiency in a display or illumination apparatus.

According to one embodiment, cohesion of the laminate for encapsulation and the organic light emitting device may be carried out using a roll to roll process.

According to one embodiment, when the laminate for encapsulation includes a carrier film, the method for manufacturing an organic light emitting apparatus further includes a step of removing the carrier film. The step of removing the carrier film may also be carried out using a roll process.

Figure 6:
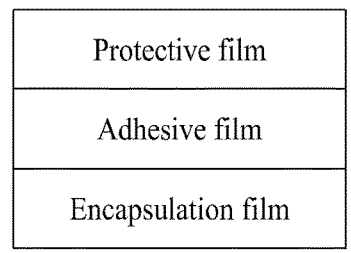
FIGS. 6 to 10 illustrate structures of a laminate for encapsulation according to embodiments of the present application.

Another embodiment of the present application provides a laminate for encapsulation including an encapsulation film; an adhesive film provided on any one surface of the encapsulation film; and a protective film provided on a surface opposite to the surface provided with the encapsulation film of the adhesive film. This is a laminate manufactured according to the methods of the embodiments described above with FIG. 1 and FIG. 2. A laminated structure of the laminate for encapsulation is illustrated in FIG. 6. As described above, such a laminate is not only useful in post processes, but may be put on the market itself since the laminate for encapsulation is readily transported or stored. The descriptions made above in the method for manufacturing a laminate for encapsulation may apply in describing the laminate for encapsulation. According to one embodiment, the laminate for encapsulation has a form wound in a roll form.

Figure 7:
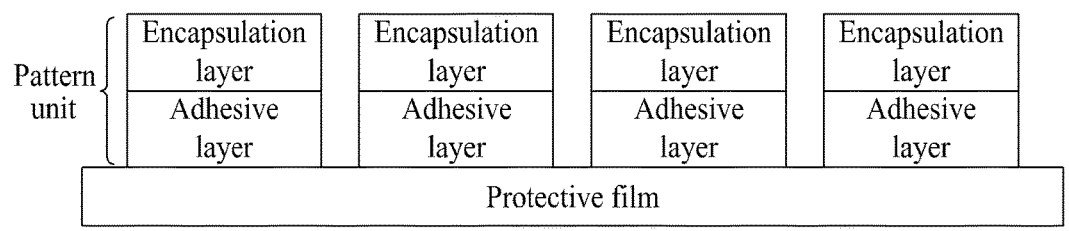
Figure 8:
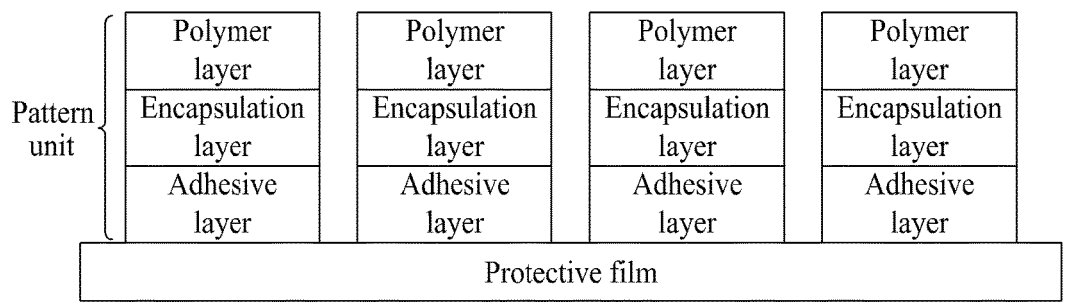
Figure 9:
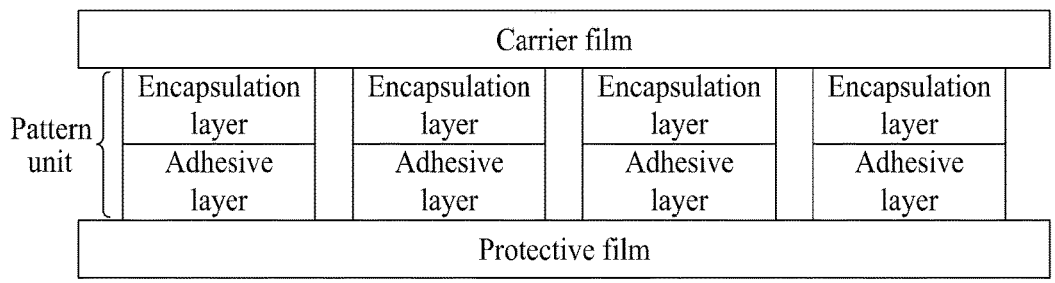
Figure 10:
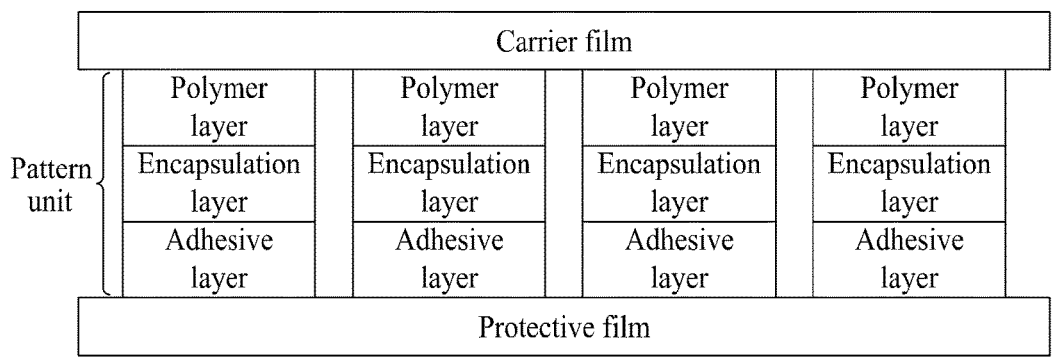

Another embodiment of the present application provides a laminate for encapsulation including two or more pattern units including an encapsulation layer and an adhesive layer provided on any one surface of the encapsulation layer, and disposed to be separated from each other; and a protective film provided on the adhesive layer side of the pattern unit, and covering all the adhesive layers of the two or more pattern units. Such a laminated structure of the laminate for encapsulation is illustrated in FIG. 7. The laminate for encapsulation may further include an additional polymer layer provided on the encapsulation layer side of the pattern unit (FIG. 8). The laminate for encapsulation is provided on the encapsulation layer side of the pattern unit, and may further include a carrier film covering all the encapsulation layers of the two or more pattern units (FIG. 9 and FIG. 10). This is a laminate manufactured according to the method of the embodiment described above with FIG. 3. As described above, such a laminate is not only useful in post processes, but may be put one the market itself since the laminate for encapsulation is readily transported or stored. The descriptions made above in the method for manufacturing a laminate for encapsulation may apply in describing the laminate for encapsulation. According to one embodiment, the laminate for encapsulation has a form wound in a roll form.

Figure 11:
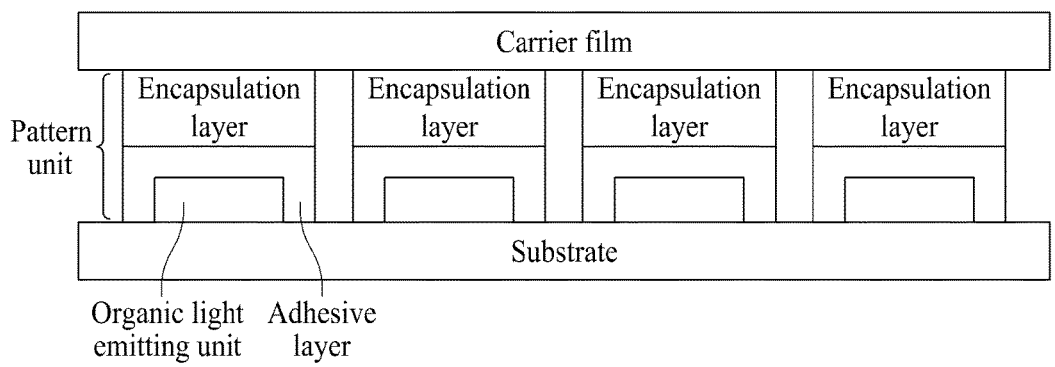
FIGS. 11 to 14 illustrate structures of an organic light emitting apparatus according to embodiments of the present application.
Figure 12:
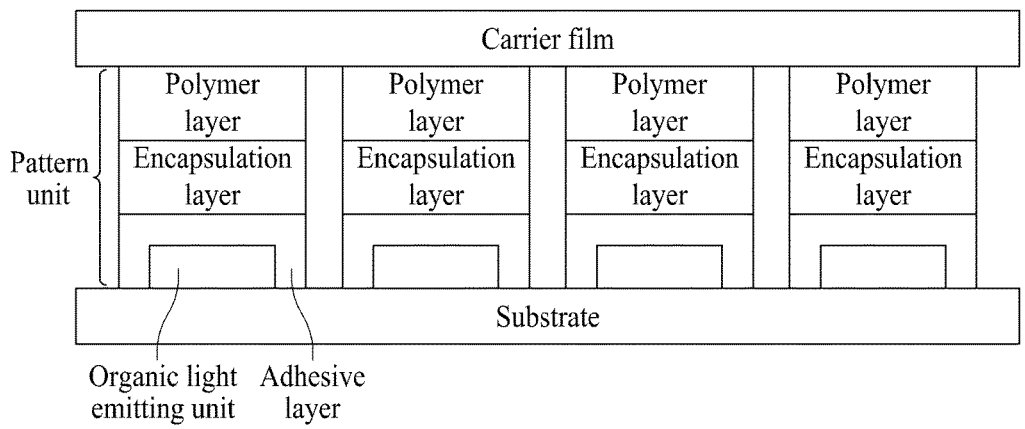

Another embodiment of the present application provides an organic light emitting apparatus including two or more pattern units including an encapsulation layer and an adhesive layer provided on any one surface of the encapsulation layer, and disposed to be separated from each other; an organic light emitting device provided on the adhesive layer side of the pattern unit and including a substrate and two or more organic light emitting units provided on the substrate, wherein each of the organic light emitting units is provided so as to correspond to each of the pattern units; and a carrier film provided on the encapsulation layer side of the pattern unit, and covering all the encapsulation layers of the two or more pattern units. This is an organic light emitting apparatus manufactured according to the method of the embodiment described above with FIG. 4. The organic light emitting apparatus according to the present embodiment has a structure in which the carrier film is not removed in FIG. 4. The descriptions made above in the method for manufacturing an organic light emitting apparatus may apply in describing the organic light emitting apparatus. According to one embodiment, the laminate for encapsulation has a form wound in a roll type. Structures of the organic light emitting apparatus are illustrated in FIG. 11 and FIG. 12.

Figure 13:
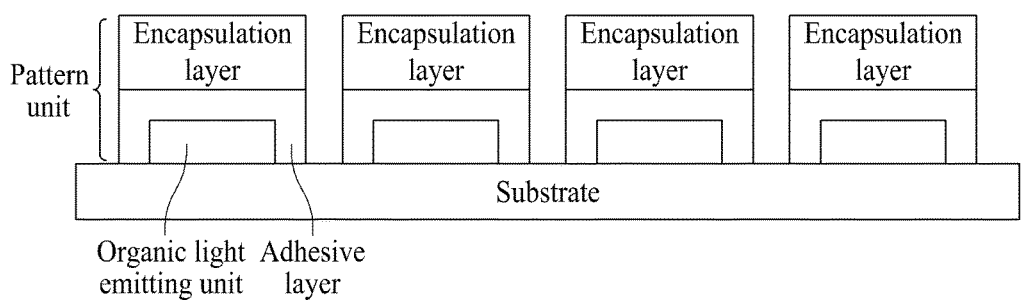
Figure 14:
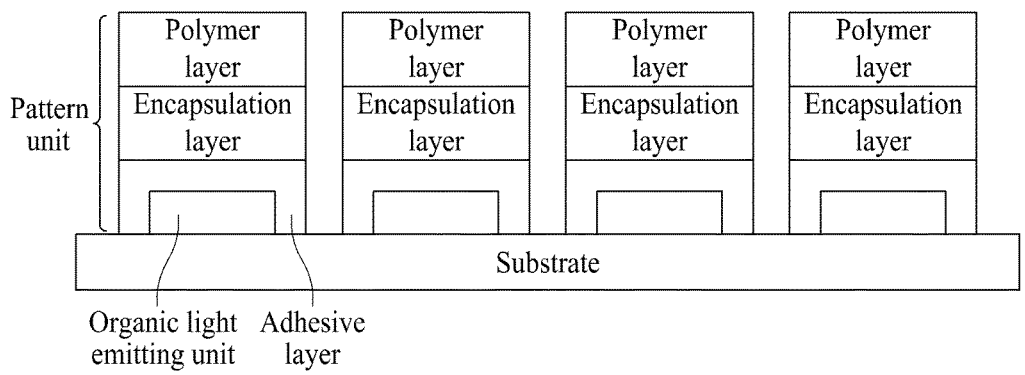

Another embodiment of the present application provides an organic light emitting apparatus including two or more pattern units including an encapsulation layer and an adhesive layer provided on any one surface of the encapsulation layer, and disposed to be separated from each other; and an organic light emitting device provided on the adhesive layer side of the pattern unit and including a substrate and two or more organic light emitting units provided on the substrate, wherein each of the organic light emitting units is provided so as to correspond to each of the pattern units. This is an organic light emitting apparatus in which the carrier film is removed from the organic light emitting apparatus manufactured according to the method of the embodiment described above with FIG. 4, or an organic light emitting apparatus using an apparatus having a sticky stage or a tray for cohesion with the organic light emitting unit. Structures of the organic light emitting apparatus are illustrated in FIG. 13 and FIG. 14. The descriptions made above in the method for manufacturing the organic light emitting apparatus may apply in describing the organic light emitting apparatus.

According to one embodiment, the organic light emitting unit includes a first electrode adjacent to the substrate, a second electrode provided opposite to the first electrode, one or more organic material layers provided between the first electrode and the second electrode. The first electrode and the second electrode are an anode and a cathode, respectively, or a cathode and an anode, respectively.

In addition, the anode may be formed with a transparent conductive oxide. Herein, the transparent conductive oxide may be at least one oxide selected from among indium (In), tin (Sn), zinc (Zn), gallium (Ga), cerium (Ce), cadmium (Cd), magnesium (Mg), beryllium (Be), silver (Ag), molybdenum (Mo), vanadium (V), copper (Cu), iridium (Ir), rhodium (Rh), ruthenium (Ru), tungsten (W), cobalt (Co), nickel (Ni), manganese (Mn), aluminum (Al) and lanthanum (La).

The anode may be famed using any one physical vapor deposition (PVD) method selected from among a sputtering method, an e-beam evaporation method, a thermal evaporation method, a laser molecular beam epitaxy (L-MBE) method, and a pulsed laser deposition (PLD) method; any one chemical vapor deposition method selected from among a thermal chemical vapor deposition method, a plasma-enhanced chemical vapor deposition (PECVD) method, a light chemical vapor deposition method, a laser chemical vapor deposition method, a metal-organic chemical vapor deposition (MOCVD) method, and a hydride vapor phase epitaxy (HVPE) method; or an atomic layer deposition (ALD) method.

The anode may further include an auxiliary electrode for a resistance improvement. The auxiliary electrode may be formed from one or more types selected from the group consisting of conductive sealants and metals using a deposition process or printing process. More specifically, the auxiliary electrode may include Cr, Mo, Al, Cu, or alloys thereof, but is not limited thereto.

An insulation layer may be further included on the auxiliary electrode. The insulation layer may be formed using materials and methods known in the art. More specifically, the insulation layer may be formed using general photoresist materials; polyimide; polyacryl; silicon nitride; silicon oxide; aluminum oxide; aluminum nitride; alkali metal oxides; alkali earth metal oxides and the like, but the material is not limited thereto. The thickness of the insulation layer may be from 10 nm to 10 µm, but is not limited thereto.

Specific materials and formation methods of the organic material layer are not particularly limited, and materials and formation methods widely known in the art may be used.

The organic material layer may be formed in a smaller number of layers using various polymer materials through a solvent process such as spin coating, dip coating, doctor blading, screen printing, inkjet printing or a heat transfer method instead of a deposition method.

The organic material layer may have a laminated structure including a light emitting layer, and including one or more selected from among a hole injection layer, a hole transfer layer, an electron transfer layer and an electron injection layer.

As a material capable of forming the hole injection layer, a material having a large work function is normally preferable so that hole injection to an organic material layer is smooth. Specific examples of the hole injection material include metals such as vanadium, chromium, copper, zinc or gold, or alloys thereof; metal oxides such as zinc oxide, indium oxide, indium tin oxide (ITO) or indium zinc oxide (IZO); and a combination of metals and oxides such as ZnO:Al or $SnO_2$:Sb; conductive polymers such as poly(3-methylthiophene), poly[3,4-(ethylene-1,2-dioxy)thiophene] (PEDOT), polypyrrole and polyaniline, and the like, but are not limited thereto.

As a material capable of forming the electron injection layer, a material having a small work function is normally preferable so that electron injection to an organic material layer is readily achieved. Specific examples of the electron injection material include metals such as magnesium, calcium, sodium, potassium, titanium, indium, yttrium, lithium, gadolinium, aluminum, silver, tin and lead, or alloys thereof; or multilayer structure materials such as LiF/Al or $LiO_2$/Al, and the same materials as the hole injection electrode material may be used, however, the electron injection material is not limited thereto.

As a material capable of forming the light emitting material, a material capable of emitting light in a visible region by receiving holes and electrons from a hole transfer layer and an electron transfer layer, respectively, and binding the holes and the electrons, and having favorable quantum efficiency for fluorescence or phosphorescence is preferable. Specific examples thereof include a 8-hydroxy-quinoline aluminum complex ($Alq_3$); a carbazole-based compound; a dimerized styryl compound; BAlq; a 10-hydroxybenzo quinolin-metal compound; a benzoxazole-, a benzthiazole- and a benzimidazole-based compound; a poly(p-phenylenevinylene) (PPV)-based polymer; a Spiro compound; polyfluorene, rubrene; a phosphorescent host CBP[[4,4'-bis(9-carbazolyl)biphenyl]; and the like, but are not limited thereto.

In addition, the light emitting material may further include a phosphorescent dopant or fluorescent dopant in order to enhance a property of fluorescence or phosphorescence. Specific examples of the phosphorescent dopant include ir(ppy)(3)(fac-tris(2-phenylpyridine)iridium) or F2Irpic[iridium(III)bis(4,6-di-fluorophenyl-pyridinato-N, C2)picolinate] and the like. As the fluorescent dopant, those known in the art may be used.

As a material capable of forming the electron transfer material, a material capable of favorably receiving electrons from an electron injection layer, moving the electrons to a light emitting layer, and having high mobility for the electrons, is suitable. Specific examples thereof include an Al complex of 8-hydroxyquinoline; a complex including $Alq_3$; an organic radical compound; a hydroxyflavon-metal complex and the like, but are not limited thereto.

The cathode may include one or more types of Al, Ag, Ca, Mg, Au, Mo, Ir, Cr, Ti, Pd, alloys thereof and the like, but is not limited thereto. The anode and the cathode may be famed with the same materials. The anode and the cathode may all be formed with transparent materials.

According to one embodiment, the organic light emitting unit further includes a light scattering layer provided between the substrate and the first electrode. The light scattering layer may include a planarization layer.

The light scattering layer is not particularly limited as long as it has a structure capable of enhancing inside light extraction efficiency of a device by inducing light scattering. For example, the light scattering layer may include a region having a refractive index of 1.7 or greater, and specifically having a refractive index of 1.7 to 3.0. By including a material having a refractive index of 1.7 or greater in the light scattering layer, a light scattering effect caused by a refractive index difference compared to other regions having relatively low refractive indexes may be obtained.

As one example of the present application, the light scattering layer may have a structure in which scattering particles are dispersed into a binder. The binder may have a higher refractive index compared to the scattering particles, and light scattering may be induced at interfaces of the binder and the scattering particles due to a refractive index difference. For example, the binder may have a refractive index of 1.7 or greater, or have a refractive index range of 1.7 to 3.0.

As another example, the light scattering layer includes scattering particles and a binder, and includes a scattering layer, on which unevenness is formed by the scattering particles, on s surface opposite to the surface adjoining a substrate; and a planarization layer formed on the scattering layer, and planarizing the surface curvature generated due to the uneven structure of the scattering layer. The light scattering layer may increase inside light extraction efficiency by having a large refractive index difference between the scattering particles and the planarization layer. The planarization layer may have a higher refractive index compared to the scattering particles, and for example, the refractive index of the planarization layer may be 1.7 or greater, or in a range from 1.7 to 3.0.

As another example, the light scattering layer may include a binder layer formed on a substrate and forming an uneven structure; and a planarization layer formed on the binder layer and forming a planar surface. For example, the refractive index of the planarization layer may be 1.7 or greater, or in a range from 1.7 to 3.0.

The scattering particles may have a spherical form, an ellipsoid form or an amorphous form, and preferably a spherical form or an ellipsoid form. An average diameter of the scattering particles may be from 100 to 300 nm, and specifically from 150 to 200 nm.

The scattering particles are not particularly limited as long as they are capable of scattering light using a refractive index difference between a binder and a planarization layer, and examples thereof may include one or more types selected from the group consisting of air, silicon, silica, glass, titanium oxide, magnesium fluoride, zirconium oxide, alumina, cerium oxide, hafnium oxide, niobium pentoxide, tantalum pentoxide, indium oxide, tin oxide, indium tin oxide, zinc oxide, silicon, zinc sulfide, calcium carbonate, barium sulfate, silicon nitride and aluminum nitride. As one example, the scattering particles may be titanium dioxide.

The binder is not particularly limited, and may include an organic, inorganic, or organic-inorganic complex binder. For example, the binder may be an inorganic or organic-inorganic complex binder. An inorganic or organic-inorganic complex binder has an advantage in device performances, particularly a lifespan, due to excellent heat resistance and chemical resistance compared to an organic binder, and has an advantage in manufacturing various devices since degradation does not occur in a high temperature process of 150° C. or higher, a photo process and an etching process and the like that may be included in a device manufacturing process. For example, the binder may be one or more types selected from the group consisting of silicon oxide, silicon nitride, silicon oxynitride, alumina, and an inorganic or organic-inorganic complex based on a siloxane bond (Si—O). For example, an inorganic binder based on a [Si—O] bond may be formed by condensation polymerization using siloxane, or an organic-inorganic complex form in which an alkyl group is not completely removed in a siloxane bond may also be used.

Constituents forming the planarization layer may be selected in the same range as the binder forming the scattering layer described above. The binder in the scattering layer and the planarization layer may use the same constituents or use different constituents. In addition, the planarization layer may further include a high refractive filler capable of increasing a refractive index. The high refractive filler is not particularly limited as long as it increases a refractive index by being dispersed into the light scattering layer, and examples thereof may include one or more types selected from the group consisting of alumina, aluminum nitride, zirconium oxide, titanium oxide, cerium oxide, hafnium oxide, niobium pentoxide, tantalum pentoxide, indium oxide, tin oxide, indium tin oxide, zinc oxide, silicon, zinc sulfide, calcium carbonate, barium sulfate and silicon nitride. In one example, the high refractive filler may be titanium dioxide.

An average particle diameter of the high refractive fillers may be from 5 nm to 30 nm, and specifically from 15 nm to 25 nm. When the particle diameters of the high refractive fillers are too small, an effect of increasing a refractive index is insignificant, and in an opposite case, light transmittance may decrease.

Generally, in an organic light emitting device, total reflection occurs inside due to a refractive index difference between each layer forming the device, and accordingly, light emitting efficiency becomes poor, and brightness may be reduced. By forming a light scattering layer including scattering particles on a substrate, the present invention enhances inside light extraction efficiency.

The light scattering layer may be formed limiting to a light emitting region of a device toward a surface on which the device is deposited. In addition, the light scattering layer may have a structure sealed by a substrate and an anode.

In order to eliminate the possibility of outside air (for example, oxygen) or moisture penetrating into a device through a path in which a light scattering layer is formed, the light scattering layer is formed limiting to a light emitting region of the device, or has a structure sealed by a substrate and an anode, and consequently, outside air or moisture penetrating into the device may be effectively prevented.

According to one embodiment, the organic light emitting apparatus further include a light scattering layer on a surface opposite to the surface provided with the first electrode of the substrate. The light scattering layer may have a structure in which scattering particles are dispersed into a binder as described above, or have a non-planar structure. The light scattering layer may be directly formed on the substrate using a method such as spin coating, bar coating and slit coating, or may be formed using a method of being prepared in a film form and attached.

According to one embodiment, the organic light emitting device is a flexible organic light emitting device. In this case, the substrate includes a flexible material. For example, thin-film-type glass capable of bending, or a plastic, or film-type substrate may be used.

A material of the plastic substrate is not particularly limited, however, a film such as PET, PEN, PEEK and PI may be generally used in a single layer or in multilayers.

One embodiment of the present specification provides a display apparatus including the organic light emitting device described above. The organic light emitting device may perform a role of a pixel or a back light in the display apparatus. As other constitutions of the display apparatus, constitutions known in the art may be used.

One embodiment of the present specification provides an illumination apparatus including the organic light emitting device described above. The organic light emitting device may perform a role of a light emitting unit in the illumination apparatus. As other constitutions of the illumination apparatus, constitutions known in the art may be used.

The invention claimed is:

1. A method for manufacturing an organic light emitting apparatus, the method comprising:
forming a laminate for encapsulation by laminating an encapsulation film, an adhesive film, and a protective film;
forming two or more pattern units including an encapsulation layer and an adhesive layer provided on any one surface of the encapsulation layer by cutting the encapsulation film and the adhesive film in a film thickness direction without cutting the protective film;

removing a side film between the pattern units so that the pattern units are separated from each other;

removing the protective film while fixing the pattern units side of the laminate for encapsulation on a stage of an apparatus or on a tray for cohesion with an organic light emitting unit; and cohering an organic light emitting device including a substrate and two or more organic light emitting units provided on the substrate to the adhesive layer side of the pattern units so that each of the pattern units and each of the organic light emitting units correspond to each other.

2. The method for manufacturing an organic light emitting apparatus of claim 1, wherein the forming a laminate for encapsulation comprises:

laminating the encapsulation film and the adhesive film; and laminating the adhesive film with the protective film.

3. The method for manufacturing an organic light emitting apparatus of claim 2, wherein the laminating the encapsulation film and the adhesive film is forming the adhesive film through coating an adhesive composition on the encapsulation film and then curing the result.

4. The method for manufacturing an organic light emitting apparatus of claim 1, wherein the forming a laminate for encapsulation comprises:

laminating the protective film and the adhesive film; and laminating the adhesive film with the encapsulation film.

5. The method for manufacturing an organic light emitting apparatus of claim 4, wherein the laminating the protective film and the adhesive film is forming the adhesive film through coating an adhesive composition on the protective film and then curing the result.

6. The method for manufacturing an organic light emitting apparatus of claim 1, wherein the encapsulation film is an inorganic material film, an inorganic material pattern film including a support layer and two or more inorganic material patterns provided on the support layer, an organic material film, or a film having a laminated structure in which an organic material layer and an inorganic material layer are laminated alternately.

7. The method for manufacturing an organic light emitting apparatus of claim 1, wherein the encapsulation film is a metal foil, or a metal clad film including an insulation layer and two or more metal patterns provided on at least one surface of the insulation layer.

8. The method for manufacturing an organic light emitting apparatus of claim 1, wherein the laminate for encapsulation includes a polymer layer provided on a surface opposite to the surface adjoining the adhesive film of the encapsulation film, and the polymer layer is cut in a film thickness direction together with the encapsulation film and the adhesive film.

9. The method for manufacturing an organic light emitting apparatus of claim 1, wherein the cohesion of the laminate for encapsulation having the pattern units and the organic light emitting device is carried out so that each of the pattern units of the laminate for encapsulation covers each of the organic light emitting units.

10. The method for manufacturing an organic light emitting apparatus of claim 1, further comprising:

removing the protective film from the laminate for encapsulation having the pattern units; and cohering the organic light emitting device including the substrate and the two or more organic light emitting units provided on the substrate to the adhesive layer side of the laminate for encapsulation having the pattern units so that each of the pattern units and each of the organic light emitting units correspond to each other.

11. The method for manufacturing an organic light emitting apparatus of claim 10, further comprising removing the carrier film from the laminate for encapsulation having the pattern units.

12. A method for manufacturing an organic light emitting apparatus, the method comprising:

forming a laminate for encapsulation by laminating an encapsulation film, an adhesive film, and a protective film;

forming two or more pattern units including an encapsulation layer and an adhesive layer provided on any one surface of the encapsulation layer by cutting the encapsulation film and the adhesive film in a film thickness direction without cutting the protective film;

removing a side film between the pattern units so that the pattern units are separated from each other;

attaching a carrier film on the side provided with the encapsulation layers of the pattern units so as to cover all the encapsulation layers of the two or more pattern units; and after attaching the carrier film, cutting the laminate so that the number of the pattern units is the same as the number of organic light emitting devices included in an apparatus including the organic light emitting devices.

* * * * *